United States Patent [19]

Riessland et al.

[11] 4,448,403
[45] May 15, 1984

[54] POSITION DRIVE

[75] Inventors: Eberhard Riessland; Karl-Heinz Krüger, both of Dresden, German Democratic Rep.

[73] Assignee: Veb Zentrum für Forschung und Technologie Mikroelekronik, Dresden, German Democratic Rep.

[21] Appl. No.: 328,092

[22] Filed: Dec. 7, 1981

[30] Foreign Application Priority Data

Dec. 9, 1980 [DD] German Democratic Rep. ... 225885

[51] Int. Cl.³ .............................................. B25B 11/00
[52] U.S. Cl. ....................................... 269/21; 269/71; 279/3
[58] Field of Search ........................ 269/21, 71, 73, 57, 269/58, 63, 285; 279/3, 5; 409/221, 225; 51/235; 74/813

[56] References Cited

U.S. PATENT DOCUMENTS

| 4,037,830 | 7/1977 | Poluzzi et al. | 279/3 |
| 4,066,943 | 1/1978 | Roch | 269/55 |
| 4,183,545 | 1/1980 | Daly | 269/21 |
| 4,184,472 | 1/1980 | Benedicto et al. | 269/21 |

Primary Examiner—Robert C. Watson
Attorney, Agent, or Firm—Michael J. Striker

[57] ABSTRACT

A position drive for a wafer in a system for testing of integrated circuit components of the wafer includes a first drive assembly for quick lifting of a wafer-supporting member towards testing probes, second drive assembly for positioning the wafer-supporting member in two stable positions in a vertical direction for compensating thickness allowances of the wafers to be tested and a third drive assembly for mechanical rotation of the wafer-supporting member through any required angle.

30 Claims, 8 Drawing Figures

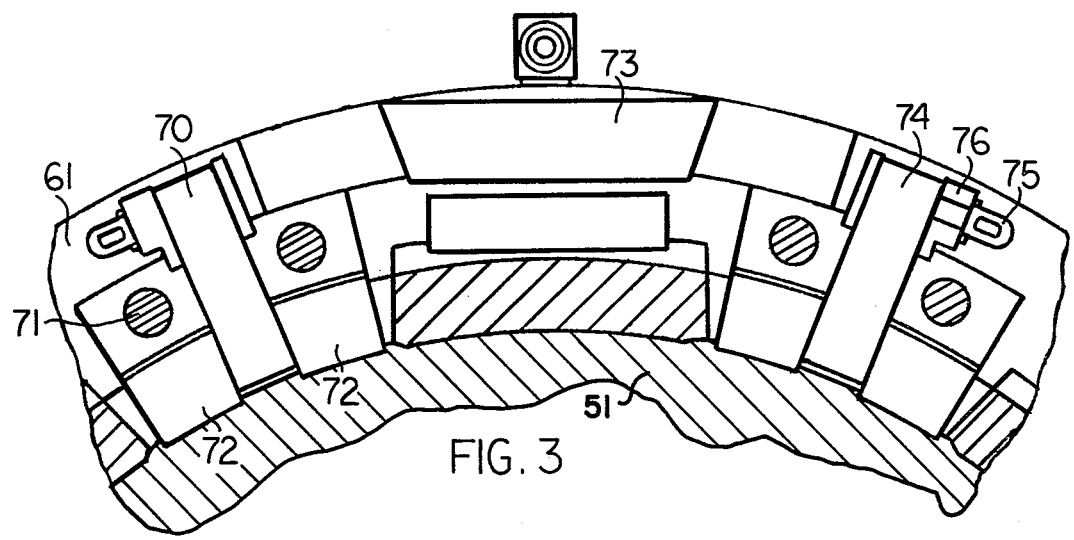
FIG. 3
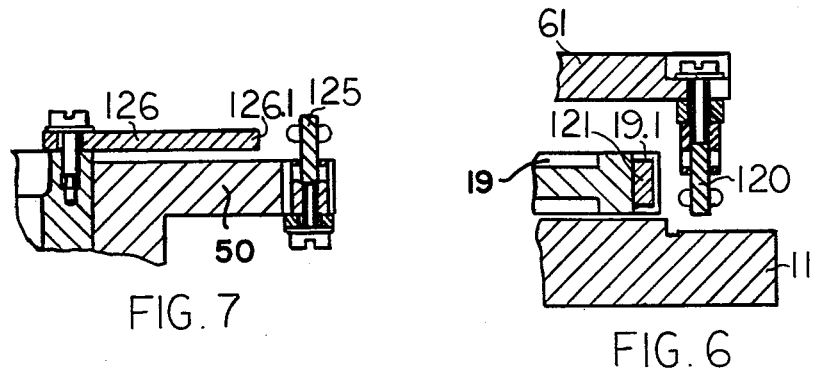
FIG. 7
FIG. 6
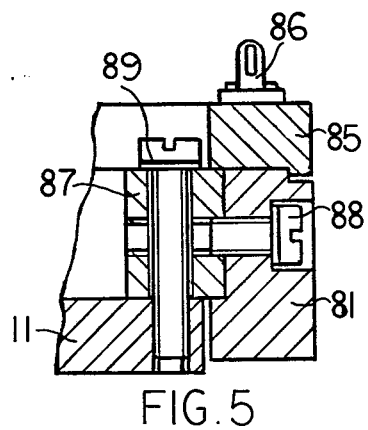
FIG. 5

POSITION DRIVE

BACKGROUND OF THE INVENTION

The present invention relates to a position drive for a wafer carrying integrated circuit components to be tested in a testing equipment. More particularly, the invention relates to a position drive provided with means for compensation for wafer-thickness allowances.

The devices for positioning a wafer with integrated circuit components in systems for grading the wafer by testing the same are known in the art.

In the art of electronic circuits the individual integrated circuits formed on the semiconductor wafer are tested by a probe which should be accurately located on each preselected point corresponding to the circuit to be tested. It is to be understood that the positioning of the probes must be very accurate and adjustable so that different integrated circuit units can be tested. When the probes are properly oriented the wafer may be stepped from position to position so that each micro-circuit is properly located to the assigned probe for testing.

The orientation in a predetermined position may be defined as a location in accordance with XY coordinates and a vertical position defined by Z coordinate. It is to be noted that the proper vertical position of the wafers relative to the probes must be controlled in order to obtain uniform contact pressure between each probe and each circuit.

In operation of the known devices of the type under consideration, the operator examines the wafer by an optical means and rotates the support carrying the wafer to bring the integrated circuits into proper X-Y orientation. The positioning relative to Z-coordinate is made thereafter.

In the East German Pat. No. 137037 a lifting device for lifting the integrated circuit wafer is described in which uniformly distributed pressurized-air nozzles are provided arranged in the support surfaces of the lifting rods whereby the vertical movement from lower to the upper position of the support is damped.

The guides for axial movement are equipped with air bearings so that wear compensation may be obtained in the device. The disadvantage of this lifting device is that the wafer supporting plates do not turn in the operation, and the device is not able to compensate for thickness allowances of the wafers to be tested.

U.S. Pat. Nos. 4,066,943 and 3,936,743 suggest a wafer-positioning drive provided with a lifting high-speed precision chuck for quick displacement of the wafers relative to the probes+ tips. The lifting chuck is equipped with a step motor for vertical displacement, which motor is coupled with an eccentric. Upon rotation of the eccentric the chuck is moved by a suitable means between two end positions. The movement resulted from the operation of the position drive is syncronous in character. The chuck is rotated about its central axis by manually operated means.

The disadvantage of this otherwise satisfactory device is that manually operated rotation of the chuck renders it difficult to make the device automatic. Furthermore, no thickness-allowances -compensation means are suggested in the known device and it is impossible to provide for such means without extensive changing the chuck for quick lifting movement.

SUMMARY OF THE INVENTION

It is therefore an object of the invention to provide a position drive which avoids the disadvantages of the prior art.

Another object of the invention is to provide an improved position drive in a system for testing a wafer with integrated circuit components.

Still another object of the invention is to provide a position drive which provides mechanical rotational movement of the wafer support through any required angle and the axial positioning of the wafer support between two positions in a vertical direction as well as quick lifting motion of the wafer support towards the testing probes.

These and other objects of the invention are attained by a position drive for positioning a wafer containing integrated circuit components in a system for testing the integrated circuit components wherein the wafer is preliminarily positioned in X-Y coordinate directions, comprising a wafer-supporting member; a base plate, means for displacement of said wafer-supporting member in a direction of an axis defined by Z coordinate between two stable positions; means for rotation of said wafer-supporting member about said axis; and means of independent lifting movement of said wafer-supporting member in a direction of said axis, said means for displacement of said wafer-supporting member between two stable positions including a lifting magnet and a uniformly rotatable slide frame surrounding said lifting magnet and connected to said wafer-supporting member, said means for rotation including a supporting ring surrounding said slide frame and adapted to actuate the uniform rotation of said slide frame.

One drive means of the invention rotates the lifting means and another drive of the invention serves for compensation for thickness allowances of the wafers to be tested by means of an additional lifting device.

The drive of the invention may further include an upper plate rigidly connected to said wafer-supporting member and to said slide frame and a lower frame spaced from said upper plate in a direction of Z-axis and rigidly connected to the slide frame, a first air bearing defined between said first plate and the lifting magnet and defining a first one of said stable positions of the wafer-supporting member relative to the lifting magnet and a second air bearing defined between the second plate and the lifting magnet and defining a second one of the two stable positions.

The drive may be further provided with first pressurized air-supplying nozzles for supplying pressurized air to said first air bearing and said second air bearing.

The supporting ring may be provided with a number of poles for actuating the rotation of said slide frame. The supporting ring may have a contacting surface and the slide frame may have a peripheral surface, said contacting surface being spaced from said peripheral surface so that third air bearings in a radial direction are formed therebetween.

The drive may further include second pressurized-air nozzles for supplying air to the third air bearings in the radial direction.

Due to the structure of the drive the slide frame is supported in the first air bearing or in the second air bearing in the axial direction and in the third air bearings in the radial direction.

Means for independent lifting movement of the wafer-supporting member may include a threaded spindle shaft supported on said base plate, a toothed wheel, a nut threadedly positioned on the spindle shaft and connected to said wheel, at least one stator adapted to rotate said toothed wheel and urging said nut to axially move along said spindle, the nut being operatively connected to the lifting magnet. This structure provides for independent movement of the wafer support in the downward and upward directions.

More than one stator can be employed in the drive of the invention; the stator may include two pole carriers each having two poles provided with coils and having teeth facing the teeth of said toothed wheel.

The teeth of the toothed wheel are uniformly distributed on a periphery thereof, and the teeth of two poles in one pole carrier are distributed in a manner similar to that of the teeth of said toothed wheel and the teeth of the two poles in a second one of the pole carriers are offset relative to the teeth of the toothed wheel. This permits one to provide a reliable control of the rotational movement of the toothed wheel.

Means for independent lifting motion may further include an axial bearing means interconnected between said nut and said lifting magnet, the axial bearing means including a bearing ring situated on said nut, two ball bearings and two bearing shells rigidly connected to each other and accommodating said ball bearings.

The drive further comprises a ball cage accommodating a plurality of balls, the spindle shaft having an outer periphery and the axial bearing means having a bearing surface, said ball cage being positioned between said bearing surface and the outer periphery so that the balls contact said outer periphery and said bearing surface.

The lifting magnet may include one or more permanent magnets. Two coils are cooperated with the permanent magnet so that the slide frame moves upwardly or downwardly between the two aforementioned stable positions.

The drive may comprise a supporting element disposed between the wafer-supporting member and the upper plate. This supporting element may be rigidly connected to said upper plate and provided with threaded sleeves for receiving setting screws extended from the supporting member for adjusting the position of the supporting element relative to the slide frame, the supporting element being electrically isolated from the upper plate.

The stationary spindle shaft may be formed with an inner opening to receive a sealing piston, the wafer-supporting member being rotatable about the sealing piston.

The drive may include a first channel system and a second channel system. The first channel system is located between the wafer-supporting member and the supporting element, the sealing piston including a vacuum nozzle for vacuum supply to said first channel system, said wafer-supporting member including a disc formed with a first radially extended bore and a second radially extended bore, a number of valves being arranged in said first bore and interconnected with said first channel system, and a number of sloped holes extending from said first channel system up to an upper surface of said disc and communicated with said first channel system so that a wafer to be tested is clamped on said upper surface of the disc by vacuum.

The upper surface of the disc may include a plurality of circular grooves communicating with the respective valves.

The sloped holes are adapted to hold by vacuum on the upper surface of the disc the wafers of diameters about 37 mm and the circular grooves are adapted to hold by vacuum the wafers of diameters of 50 mm+n.25 mm wherein nE {0(1) 4}.

The sealing piston may be further provided with a pressured air nozzle connected to the second channel system, an electrical connection, the disc being electrically connected to said electrical connection.

The drive in accordance with the invention may further include a conical element for electrically connecting said disc to said electrical connection, said conical element being biased by a compression spring to assure the electrical connection.

The supporting ring may be provided with feet for connecting the supporting ring to the base plate.

The feet may be mounted on the base plate by means of axially adjustable sleeves screwed to the base plate.

The drive may further comprise first light means for defining the position of said uniformily rotated slide frame, including a first light element on said slide frame and a web on said frame carrying a mirror front surface cooperating with said first light element, and second light means for defining the position of the toothed wheel relative to the base plate and including a second light element on the supporting ring and a mirror surface on the toothed wheel cooperating with the second light element.

The second light element may be installed within the nut and indicate the position of the nut relative to the spindle shaft so that angular position of the slide frame as well as its axial position in Z-coordinate direction will be clearly defined.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWINGS

FIG. 3 is a partial view of a supporting ring carrying poles;

FIG. 5 is a partial sectional view of a base plate connected to a pole carrier of the stator shown in FIG. 4;

FIG. 6 is a partial sectional view of the base plate in relation to the supporting ring provided with a first light element;

FIG. 7 is a partial sectional view of the drive provided with a second light element.

DETAILED DESCRIPTION OF THE PREFERRED EMBODIMENTS

Figure 1:
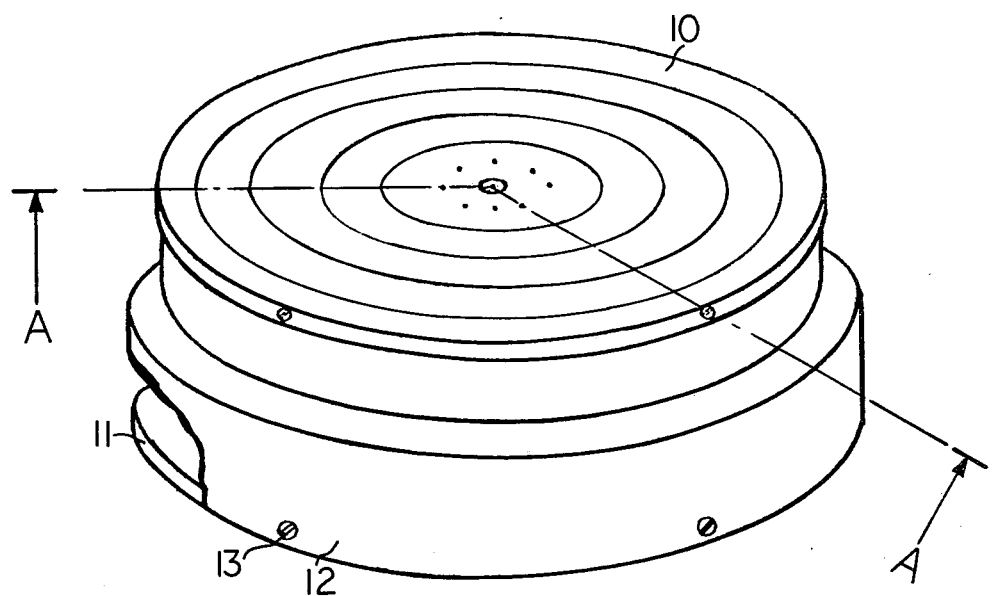
FIG. 1 is a perspective view of a position drive for a testing device for testing of integrated circuit components of wafers, according to the invention.

In reference to the drawings, FIG. 1 depicts a perspective view of the position drive for positioning a wafer with integrated circuits, which is generally designated as 10. The position drive 10 is secured to a base plate 11 and covered with a cover 12 which by means of bolts 13, is connected to the base plate 11.

Figure 2:
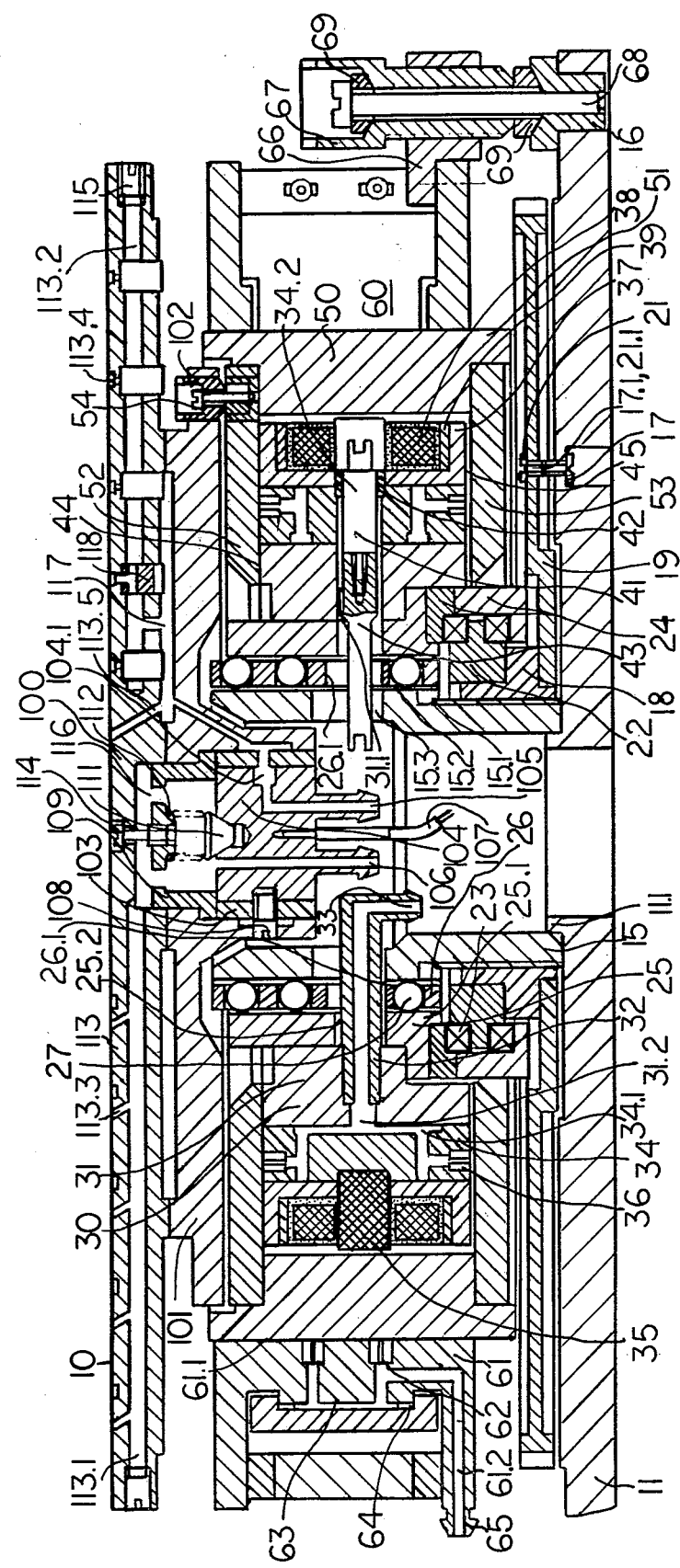
FIG. 2 is a sectional view on line A—A of FIG. 1.

FIG. 2 is a section along line A—A of FIG. 1. The base plate 11 partially shown in section in FIG. 2 has four setting screws (not shown in the drawing) by which the position drive 10 may be connected to the other components of the testing device. The base plate 11 is formed with a central bore which is surrounded with a centering flange 11.1.

A spindle sleeve 15 is mounted on the centering flange 11.1 and is secured to the base plate 11 by screws. Dash-dotted lines illustrated in the drawing show the locations of the screws not depicted in the drawing.

A threaded bushing or sleeve 16 is mounted in the peripheral portion of the base plate 11; the purpose of threaded bushing 16 will be explained in detail below. The spindle sleeve 15 is provided at its lower portion with an outer thread 15.1 whereas its upper portion forms a cylindrical bearing surface 15.2. In the upper portion the spindle sleeve 15 is formed with a longitudinal vertically extending opening 15.3. Threadedly mounted on the outer thread 15.1 of the spindle sleeve 15 is a nut 18 which carries a toothed wheel 19 made out of soft iron.

As seen in FIG. 2 a first setting screw 17 extends through the base plate 11 whereas a second setting screw 21 extends through the toothed wheel 19 in a direction opposite to that of screw 17. The setting screw 17 has a setting pin 17.1 which is positioned above the level of the base plate 11. The second setting screw 21 is so secured in the toothed wheel 19 that a setting pin 21.1 thereof cooperates with the respective setting pin 17.1 of screw 17 upon the downward movement of the toothed wheel 19 through the nut 18 movable about spindle sleeve 15; such a structure serves to prevent further undesirable rotation of the toothed wheel 19.

The nut 18 is provided with a stepped portion which carries a bearing ring 22. The bearing ring 22 has an upper and lower bearing surfaces which receive ball bearings 23.

The upper and lower ball bearings 23 are mounted in two coupled with one another bearing boxes 24 and together with the bearing ring 22 form an axial bearing.

A sleeve 25 is disposed on the upper bearing box 24, the inner opening of the sleeve 25 constituting a bearing surface 25.1.

There is located between the bearing surfaces 15.2 and 25.1 a ball cage 26 with balls 27. The bearing surface 25.1 surrounds the ball cage 26. In the sleeve 25 holes 25.2 are provided and in ball cage 26 oblong openings 26.1 are formed which communicate with lengthwise openings 15.3 which serve for receiving electrical and pneumatical conductors of the drive, as will be explained in detail later.

The flange of the sleeve 25 carries a lifting magnet 30. The inner ring 31 of the lifting magnet 30 is connected by means of screws through the step of sleeve 25 to the upper bearing box 24. The above mentioned screws are not shown in the drawing but symbolized by dash-dotted lines. The inner ring 31 is formed with openings 31.1 and 31.2 having an internal thread and correlated with the aforementioned holes 25.2.

A hose connection 32 is threaded into the opening 31.2, which hose connection through lengthwise openings 26.1 and 15.3 extends into the interior of the spindle sleeve 15; the hose connection 32 terminates with a hose connection 33 which is mounted in the inner space of the sleeve 15. A magnet carrier 34 with a permanent magnet 35 surrounds the lifting magnet 30.

The magnet carrier 34 includes a channel system 34.1 which communicates the opening 31.2 with distributing nozzles 36 which are positioned concentrically to the sleeve 15, the nozzles 36 being formed at the upper and lower sides of the magnet carrier 34. The magnet carrier 34 is enclosed at the lateral sides thereof with two outer rings 37. Each outer ring 37 and the permanent magnet 35 form a clearance to accommodate a coil 38 of the magnet and an isolating ring 39 surrounding the respective coil. The coils 38 are of course, isolated in a conventional fashion. Four ends of two coils 38 are respectively secured to three soldering connections 41 one of which is illustrated in the sectional view of the drive. The soldering connections 41 are glued through sleeves 42 in openings 34.2 to the rings 37. A portion of the soldering connection 41 which extends through the opening 31.1 is provided with a thread, an adapter 43 being threaded to that portion. As seen in FIG. 2, adapter 43 extends into the interior of the spindle sleeve 15.

The inner ring 31 of the lifting magnet, the magnet carrier 34 and the outer ring 37 of the magnet form respectively an upper 44 and a lower 45 air bearing surfaces.

The shape of the lifting magnet 30 is rotationally symmetrical. The lifting magnet 30 and coils 38 are surrounded with a rotationally symmetrical slide frame 50. The slide frame 50 includes a toothed ring 51 provided at the peripheral portion thereof. The toothed ring 51 surrounds an upper and lower circular plates 52 and 53 of which upper plate 52 carries a threaded sleeve 54.

A distance between the inner surface of the toothed ring 51 and the permanent magnet 35 provides an air clearance equal to about 0.2 mm. Special holes for ventilation not illustrated herein are provided in plates 52 and 53.

The clearance of plates 52, 53 is 0.4 mm larger than the spacing of the air bearing surfaces 44, 45 so that in cooperation of the slide frame 50 and thus plates 52, 53 with the lifting magnet 30 two stable positions of the slide frame 50 relative to the magnet 30 will be obtained. In operation, when an impulse is applied to coils 38 the slide frame 50 will be switched between those two stable positions.

Upon application of a pressurized air to the nozzles 36 and owing to the cooperation of frame 50 with permanent magnet 35, two stable positions of the slide frame 50 relative to the lifting magnet 30 are attained, namely, one upper and one lower position.

When voltage is applied to coils 38 the slide frame 50 will be switched between these two positions.

The pressurized air applied to the hose connection 33 and passed through nozzles 36 forms an air bearing with clearance about 10 . . . 20 $\mu$m in one of the selected stable positions between the air bearing surface 44 and plate 52 or the air bearing surface 45 and plate 53.

If coils 38 are switched over, the slide frame 50 moves from one position to another whereby the such constructed air bearing acts as a cushion or pad.

The slide frame 50 together with the toothed ring 51 forms a rotor which is rotatably supported in a supporting ring 60. A flange 61 of the supporting ring 60 surrounds the toothed ring 51. Flange 61 at the circumference of ring 60 is formed with eight recesses which constitute eight surfaces 61.1 in contact with the outer cylindrical surface of the toothed ring 51. A clearance about 10 . . . 20 μm is provided between the flange 61 and the toothed ring 51, for an air bearing. As seen in FIG. 2 nozzles 62 are arranged in the supporting ring 60 at the surfaces 61.1, which nozzles connect the above mentioned clearance with a distributing space 63. The space 63 is sealed with a plate 64. Each of the eight distributing spaces has a corresponding channel system 61.2 arranged in the flange 61, which distributing spaces communicate with a hose connection 65.

In symmetrical rotational movement of the slide frame 50 the latter rotates about the lifting magnet 30 in such a manner that frame 50 takes eight angular positions to form eight air bearings in a radial direction between the toothed ring 51 and surfaces 61.1 of the flange 61 and is held in each respective axial position corresponding either to the air bearing between the surface 44 and plate 52 or air bearing between the surface 45 and plate 53.

Flange 61 is provided with four feet 66 rigidly secured thereto, a sleeve 67 being threadedly inserted into each respective foot. Sleeves 67 serve for adjusting the axial position of the supporting ring 60 relative to the base plate 11. After centering of supporting ring 60 in order to establish the required air bearing, the ring 60 by means of sleeves 67, screws 68 and cup-shaped discs 69 is rigidly secured in the above mentioned threaded bushings 16.

With reference to FIG. 3 it is seen that flange 61 of supporting ring 60 is provided with eight recesses (two neighboring recesses are depicted in the drawing) each accommodating a pole 70 which is connected to the flange 61 by pins 71. Each pole 70 has two toothed surfaces 72. Two adjacent poles 70 are connected with one permanent magnet 73 positioned intermediate two poles 70. A respective coil 74 is wound about the assigned pole, the ends of each coil being respectively connected to a connection for soldering 75 which in turn is mounted on a band 76 to which pole 60 is secured.

The toothed surfaces 72 and the toothed ring 51 have teeth with a uniform distribution and made out of magnetic material. These teeth are not illustrated in the drawings. The teeth of four toothed surfaces 72 of the second one of the adjacent poles are offset relative to the teeth of the toothed ring 51. Due to such construction a suitable control of a tangential force between poles 70 and toothed ring 51 may be obtained to thus provide the controllable rotation of slide frame 50 in the above described air bearings.

Figure 4:
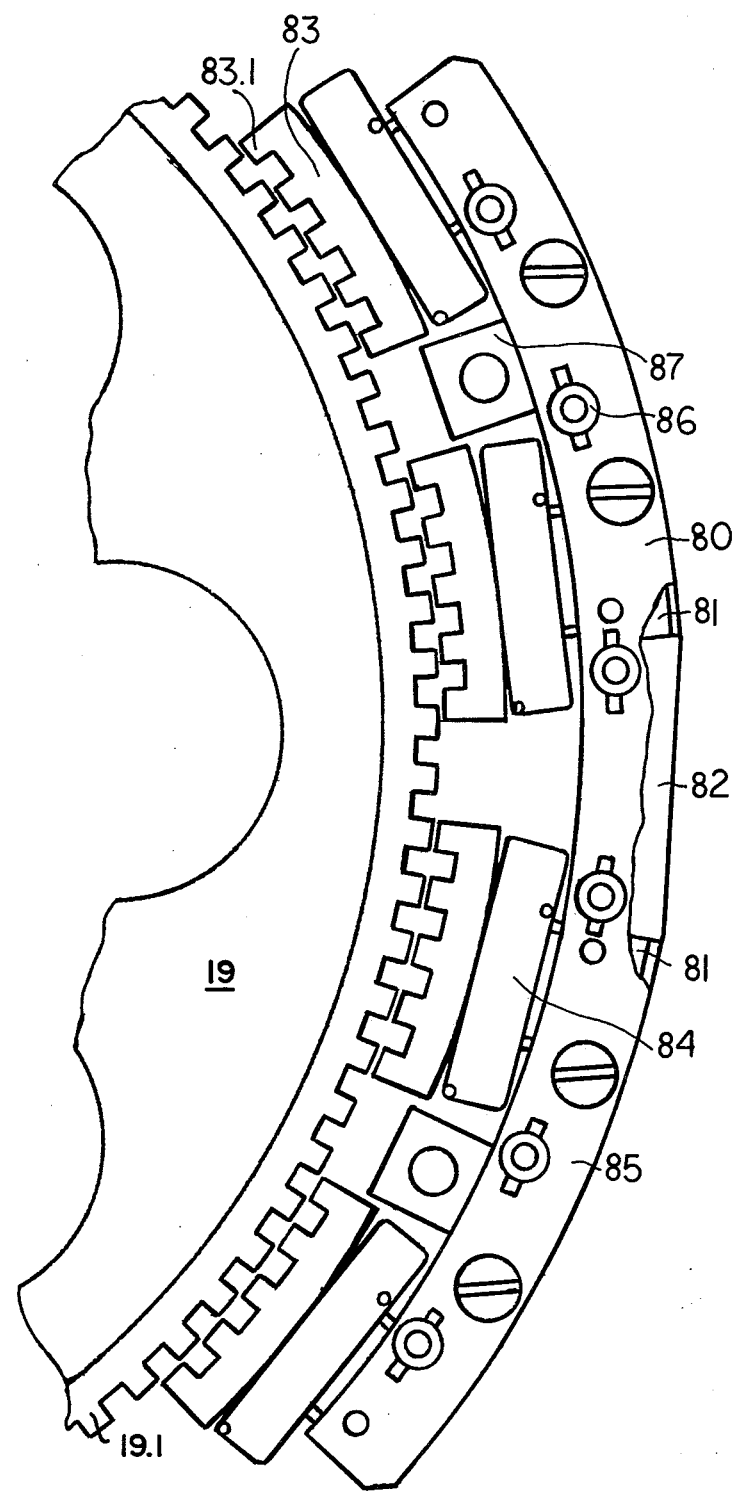
FIG. 4 is a partial view of a toothed-wheel of the drive of the invention in assembly with a stator.

The toothed wheel 19 further illustrated in FIG. 4 is provided with a plurality of peripheral teeth 19.1 and is surrounded with two stators 80 which form a drive for axial displacement of the slide frame 50. Only one stator 80 is illustrated in FIG. 4. The stator 80 includes two pole carriers 81. A permanent magnet 82 is disposed between pole carriers 81. Two poles 83 are connected to each pole carrier 81, which poles carry respective coils 84. The pole carriers 81 and the permanent magnet 82 are arranged on a frame 85. Respective soldering tabs 86 are positioned on frame 85 and electrically isolated therefrom. The ends of coils 84 are connected to tabs 86.

The toothed wheel 19 has teeth 19.1 and poles 83 have teeth 81 which are spaced from teeth 19.1 at a distance of about 0.15 mm. Teeth 83.1 of one group of poles 83 are distributed in the manner corresponding to that of wheel 19 and teeth of another group of poles 83 are offset relative to the teeth 19.1 so that the suitable control of coils 84 in rotation of toothed wheel 19 and thus vertical movement of nut 18 relative to spindle sleeve 15 can be obtained. The control of the movement of slide frame 50 in upward and downward directions caused by respective movement of lifting magnet 30 therefore may be provided. At this time the slide frame 50 does not turn because it is held in one of its angular positions by the magnetic system of toothed ring 51 and poles 70 as was described above.

With reference to FIG. 5, a mounting arrangement of the pole carrier 81 in the frame 85 is shown. Two members 87 are connected to each stator 80, which members connect frame 85 to the base plate 11 by means of bolts 89.

Referring back to FIG. 2 it is seen that slide frame 50 carries a wafer supporting element 100. The wafer-supporting element 100 is situated on a supporting member 101 which supports at its periphery setting screws 102 (one setting screw 102 is shown in the drawing). The supporting member 101 is supported by means of screws 102 in threaded sleeves 54 which are disposed in the respective recesses of the upper plate 52. Setting screws 102 serve for adjusting the rotational movement of wafer supporting element 100 without a tumbling error.

Supporting member 101 has an axial bore in which a sleeve 103 carrying a sealing piston 104 is located. The sealing piston has a first hose connection 105 for vacuum, a second hose connection 106 for pressurized air and an electrical connection 107 for contacting the wafer to be mounted on the supporting element 100.

A threaded pin 108 connected to supporting member 101 extends with its unthreaded portion through the sleeve 103 into a circular groove 104.1 formed in the sealing piston 104. By positioning the pin 108 the axial position of sleeve 103 and thus piston 104 may be adjusted and the supporting member 101 can rotate about the sealing piston 104.

In the axial bore of supporting member 101, above the piston 104, an insert 109 is positioned. A conical element or cone 111 provided with a compression spring 112 is mounted between the piston 104 and the insert 109; the spring 112 assures the electrical contact of the electrical connection 107 via sealing piston 104 with the insert 109.

The supporting member 101 supports through the insert 109 a centering disc 113 of the wafer-supporting element 100. As shown in FIG. 2, disc 113 is secured to the insert 109 by a screw 114. At the same time screw 114 provides for the electrical connection between disc 113 and connection 107.

The centering disc 113 is formed with radial openings or bores 113.1 and 113.2 which are closed with respective sealing screws 115.

The insert 109 is formed with a chamber which forms a first channel system 116 which communicates the pressured air hose connection 106 with the opening or bore 113.1 which in turn is connected with a plurality of inclined holes 113.3 formed in the centering disc 113 and extended up to the upper surface thereof.

Upon application of pressurized air to the hose connection 106 the non-illustrated wafer will move in a transport direction from the surface of the disc 113 and lie on an air cushion formed by the pressurized air.

A second channel system 117 is formed between the vacuum hose connection 105 and the opening or bore 113.2 of the centering disc 113. A number of valves 118 are disposed in circular grooves 113.4 provided in the radial opening or bore 113.2, which valves are adjustable in two positions by means of screws 119. After the required adjustment of valves 118 vacuum is applied through hose connection 105 into the opening 113.2 and therefore into circular grooves 113.4. The channel system 117 further includes eight sloped holes 113.5 formed in the disc 113 and extended up to the upper surface of the centering disc. When vacuum is applied to system 117 the application of the pressurized air is simultaneously discontinued at the nose connection 105 and the wafers of normally utilized diameters of 37 mm or 1½" will be clamped by vacuum in openings 113.5 whereas the wafers of diameters of 50 mm or 2" to 150 mm or 6" will be clamped on disc 113 by vacuum in circular grooves 113.4.

The wafer supporting element 100 performs all the movements of slide frame 50, such as rotation through any required angle, constant axial displacement for compensation of wafer-thickness allowances and quick lifting movement for contacting the wafer to be tested with the probes of the testing equipment As seen in FIG. 6 the drive according to the invention is provided with a first light element 120 mounted on the flange 61 of supporting ring 60. A mirror surface 121 which is glued between two teeth 19.1 of the toothed wheel 19 reflects the light. The position of the mirror surface relative to the light element 120 indicates the position of the angular toothed wheel 19.

A second light element 125 illustrated in FIG. 7 is disposed on the slide frame 50. A web 126 mounted on the toothed ring 51 is provided with a front mirror surface 126.1 which closes the light path from light element 125 at a predetermined angular position of slide frame 50. Both light elements 120, 125 close the light when the angular position and axial position of slide frame 50 and thus wafer supporting element 100 are accurately defined.

Figure 8:
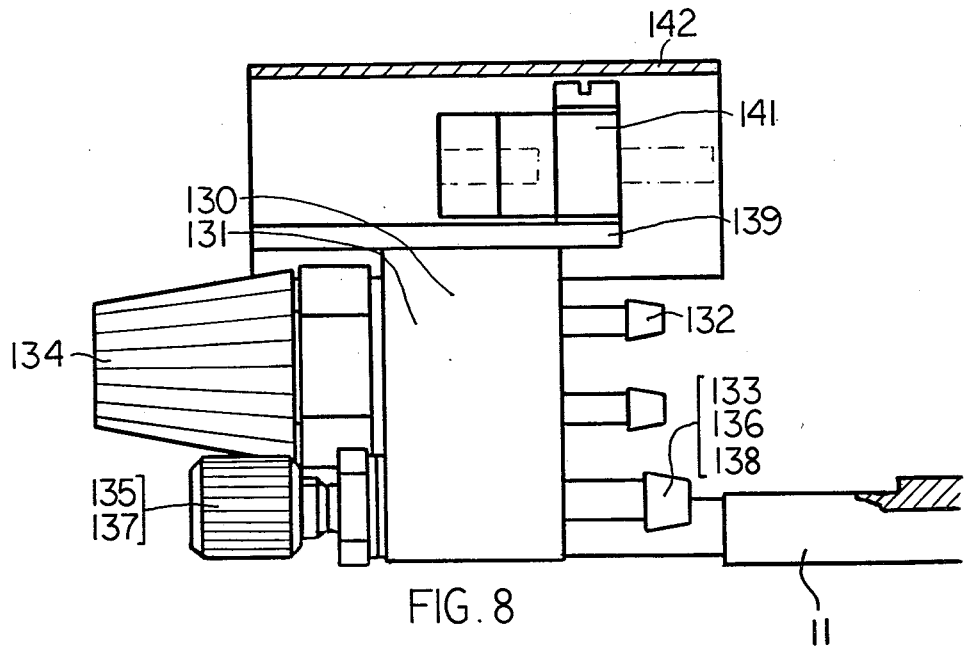
FIG. 8 is a side view, partially in section, of the base plate supporting a connection assembly of the drive.

In reference to FIG. 8 it is seen that base plate 11 carries located at its periphery connection block 130 which includes a base 131 for receiving hose connections 132, 133, 136 and 138. The connection 132 is coupled to a non-illustrated hose leading to the hose connection 65 of the drive. Hose connection 133 is coupled through a hose with the pressurized air hose connection 33.

The connections 132 and 133 are connected through respective channels in the interior of the base 131 with a first main connection 134 for pressurized air supply for forming air bearings in the drive. A second main connection 135 is connected through hose connection 136 and a non-shown hose with the vacuum hose connection 105 and thus forms a vacuum supply. A third main connection 137 is connected with the pressurized air connection 106 via the connection 138 and the respective hose and forms an transporting-air supply.

A plate 139 is arranged on the upper surface of base 131 which accommodates a plug 141 which is covered with a cover 142. Plug 141 is electrically connected with soldering tabs 86, adapter 43, electrical connection 107 and light elements 120, 125. The connection block 130 renders it possible to significantly facilitate all the connections of the drive of the invention to a non-illustrated but known in the art control device.

It will be understood that each of the elements described above, or two or more together, may also find a useful application in other types of position drives for positioning wafers in testing devices differing from the types described above.

While the invention has been illustrated and described as embodied in a position drive, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A position drive for positioning a wafer containing integrated circuit components in a system for testing the integrated circuit components wherein the wafer is preliminarily positioned in X-Y coordinate directions, comprising a wafer-supporting member; a base plate; first means for displacement of said wafer-supporting member in a direction of an axis defined by Z coordinate between two stable positions; means for rotation of said wafer-supporting member about said axis; and second means for displacement of said wafer-supporting member in a direction of said axis, said second displacement means being adapted to displace said supporting member independently from said first displacement means, said first means for displacement of said wafer-supporting member between two stable positions including a lifting magnet and a uniformly rotatable slide frame surrounding said lifting magnet and connected to said wafer-supporting member, said means for rotation including a supporting ring surrounding said slide frame and adapted to actuate the uniform rotation of said slide frame.

2. The drive of claim 1, further including an upper plate rigidly connected to said wafer-supporting member and to said slide frame, and a lower plate spaced from said upper plate in a direction of said axis and rigidly connected to said slide frame, a first air bearing defined between said upper plate and said lifting magnet and defining a first one of said stable positions of said wafer-supporting member relative to said lifting magnet and a second air bearing defined between said lower plate and said lifting magnet and defining a second one of said stable positions.

3. The drive of claim 2, further including first pressurized air-supplying nozzles for supplying pressurized air to said first air bearing and said second air bearing.

4. The drive of claim 3, wherein said supporting ring is provided with a number of magnet poles for actuating the rotation of said slide frame.

5. The drive of claim 4, wherein said supporting ring has a contacting surface and said slide frame has a peripheral surface, said contacting surface being spaced from said peripheral surface so that third air bearings in a radial direction are formed therebetween.

6. The drive of claim 5, further including second pressurized-air nozzles for supplying air to said third air bearings in the radial direction.

7. The drive of claim 6, wherein said slide frame is selectively supported on said first air bearing or on said second air bearing in said axial direction depending on the respective one of said two stable positions and is supported in said third air bearings in said radial direction.

8. The drive of claim 7, wherein said second displacement means include a threaded spindle shaft supported on said base plate, a toothed wheel, a nut threadedly positioned on said spindle shaft and connected to said wheel, at least one stator adapted to rotate said toothed wheel and urging said nut to axially move along said spindle, said nut being operatively connected to said lifting magnet.

9. The drive of claim 8, wherein said stator includes two pole carriers each having two magnet poles provided with coils and having teeth facing the teeth of said toothed wheel.

10. The drive of claim 9, wherein the teeth of said toothed wheel are uniformly distributed on a periphery thereof, the teeth of said two poles in one pole carrier being distributed in a manner similar to that of the teeth of said toothed wheel and the teeth of said two poles in a second one of said pole carriers being offset relative to the teeth of the toothed wheel.

11. The drive of claim 9, wherein said second displacement means further include an axial bearing means interconnected between said nut and said lifting magnet.

12. The drive of claim 11, wherein said axial bearing means include a bearing ring situated on said nut, two ball bearings and two bearing boxes rigidly connected to each other and accommodating said ball bearings.

13. The drive of claim 12, further including a ball cage accommodating a plurality of balls, said spindle shaft having an outer periphery and said axial bearing means having a bearing surface, said ball cage being positioned between said bearing surface and said outer periphery so that the balls contact said outer periphery and said bearing surface.

14. The drive of claim 3, wherein said lifting magnet includes at least one permanent magnet.

15. The drive of claim 7, further including a supporting element disposed between said wafer-supporting member and said upper plate.

16. The drive of claim 15, wherein said supporting element is rigidly connected to said upper plate and provided with threaded sleeves for receiving setting screws extended from said supporting element for adjusting the position of said supporting element relative to said slide frame, said supporting element being electrically isolated from said upper plate.

17. The drive of claim 16, further including a sealing piston, said spindle shaft being formed with an inner opening, said sealing piston being positioned in said opening, said wafer-supporting member being rotatable about said sealing piston.

18. The drive of claim 17, further including a first channel system located between said wafer-supporting member and said supporting element, said sealing piston including a vacuum hose connection for vacuum supply to said second channel system, said wafer-supporting member including a disc formed with a first radially extended bore and a second radially extended bore, a number of valves being arranged in said first bore and interconnected with said first channel system, and a number of sloped holes extending from said first channel system up to an upper surface of said disc and communicated with said first channel system so that a wafer to be tested is clamped on said upper surface of the disc by vacuum.

19. The drive of claim 18, wherein said upper surface of said disc includes a plurality of circular grooves communicating with the respective valves.

20. The drive of claim 19, wherein said sloped holes are adapted to hold by vacuum on said upper surface of the disc the wafers of diameters about 37 mm and said circular grooves are adapted to hold by vacuum the wafers of diameters of 50 mm+n.25 mm wherein nE {0 (1) 4}.

21. The drive of claim 19, wherein said sealing piston is provided with a pressurized air hose connection and an electrical connection, said disc being electrically connected to said electrical connection.

22. The drive of claim 21, further including a conical element for electrically connecting said disc to said electrical connection, said conical element being biased by a compression spring to assure the electrical contact of said electrical connection with said disc.

23. The drive of claim 22, further including an insert connected to said disc by a screw and supporting said conical element.

24. The drive of claim 7, wherein said supporting ring is provided with feet for connecting the supporting ring to said base plate.

25. The drive of claim 24, wherein said feet are mounted on said base plate by means of axially adjustable sleeves screwed to said base plate.

26. The drive of claim 8, wherein said base plate has a first setting screw and said toothed wheel has a second setting screw facing said first setting screw and cooperating therewith for adjusting the position of said toothed wheel relative to said base plate.

27. The drive of claim 8, including first light means for defining the position of said uniformly rotated slide frame, including a first light element on said slide frame and a web on said frame carrying a mirror front surface cooperating with said first light element.

28. The drive of claim 9, including second light means for defining the position of said toothed wheel relative to said base plate and including a second light element on said supporting ring and a mirror surface on said toothed wheel cooperating with said second light element.

29. The drive of 21, further including a second channel system between said second radially extended bore of said disc and said vacuum hose connection of said sealing piston.

30. The drive of claim 29, wherein said disc being formed with a plurality of inclined holes extending from said second radially extended bore up to an upper surface of said disc to apply pressurized air to said upper surface contacting a wafer to be tested.

* * * * *